(12) United States Patent
Furuhata et al.

(10) Patent No.: US 10,651,278 B2
(45) Date of Patent: May 12, 2020

(54) SEMICONDUCTOR DEVICE AND METHOD OF MANUFACTURING SEMICONDUCTOR DEVICE

(71) Applicant: Mitsubishi Electric Corporation, Chiyoda-ku (JP)

(72) Inventors: Takeo Furuhata, Tokyo (JP); Tomohiro Shinagawa, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/761,513

(22) PCT Filed: Jun. 13, 2016

(86) PCT No.: PCT/JP2016/067481
§ 371 (c)(1),
(2) Date: Mar. 20, 2018

(87) PCT Pub. No.: WO2017/115479
PCT Pub. Date: Jul. 6, 2017

(65) Prior Publication Data
US 2019/0067421 A1    Feb. 28, 2019

(30) Foreign Application Priority Data

Dec. 28, 2015  (JP) ................................ 2015-255813

(51) Int. Cl.
*H01L 29/16* (2006.01)
*H01L 29/20* (2006.01)
(Continued)

(52) U.S. Cl.
CPC ........ *H01L 29/1602* (2013.01); *C23C 16/271* (2013.01); *C23C 16/274* (2013.01);
(Continued)

(58) Field of Classification Search
CPC ............. H01L 29/1602; H01L 23/3732; H01L 21/02527; H01L 2924/351–35121
See application file for complete search history.

(56) References Cited

U.S. PATENT DOCUMENTS

| 2003/0080411 A1* | 5/2003 | Baek ..................... H01L 23/433 257/704 |
| 2013/0248879 A1 | 9/2013 | Gambin et al. |
| 2014/0264777 A1* | 9/2014 | Hobart ................ H01L 23/3732 257/627 |

FOREIGN PATENT DOCUMENTS

| JP | 2015-517205 A | 6/2015 |
| WO | 2013/142156 A1 | 9/2013 |

OTHER PUBLICATIONS

International Search Report dated Aug. 30, 2016 in PCT/JP2016/067481, filed on Jun. 13, 2016.

* cited by examiner

*Primary Examiner* — Selim U Ahmed
*Assistant Examiner* — Evan G Clinton
(74) *Attorney, Agent, or Firm* — Oblon, McClelland, Maier & Neustadt, L.L.P.

(57) ABSTRACT

An object is to provide a technology capable of suppressing a crack of a crystalline nitride layer which is generated due to a stress caused by difference in thermal expansion coefficients between a crystalline nitride and diamond. A semiconductor device includes a crystalline nitride layer, a structure containing silicon, and a diamond layer. The structure is disposed on a first main surface of the crystalline nitride layer. The diamond layer is disposed at least on a lateral portion of the structure and has a void between the diamond layer and the first main surface of the crystalline nitride layer. The void is a stress absorbing space, for example.

12 Claims, 7 Drawing Sheets

(51) Int. Cl.
*H01L 21/02* (2006.01)
*C23C 16/30* (2006.01)
*C23C 16/27* (2006.01)
*H01L 23/552* (2006.01)
*H01L 23/367* (2006.01)
*H01L 23/373* (2006.01)
*H01L 29/205* (2006.01)
*H01L 29/66* (2006.01)
*H01L 29/778* (2006.01)

(52) U.S. Cl.
CPC ........ *C23C 16/303* (2013.01); *H01L 21/0245* (2013.01); *H01L 21/0262* (2013.01); *H01L 21/02389* (2013.01); *H01L 21/02494* (2013.01); *H01L 21/02527* (2013.01); *H01L 23/367* (2013.01); *H01L 23/3732* (2013.01); *H01L 23/552* (2013.01); *H01L 29/2003* (2013.01); *H01L 29/205* (2013.01); *H01L 29/66462* (2013.01); *H01L 29/7783* (2013.01); *H01L 21/02658* (2013.01); *H01L 29/778* (2013.01)

SEMICONDUCTOR DEVICE AND METHOD OF MANUFACTURING SEMICONDUCTOR DEVICE

TECHNICAL FIELD

The present invention relates to a semiconductor device including a crystalline nitride layer, and a manufacturing method therefor.

BACKGROUND ART

Nitrides such as gallium nitride (GaN), aluminum nitride (AlN), and aluminum gallium nitride (AlGaN) have a high dielectric breakdown electric field and a high carrier velocity, and hence application to a high-output and high-frequency electronic device or optical device is expected. However, there is a problem in that output characteristics are limited due to self-heat generation at die time of a high output operation.

As a countermeasure therefor, for example. Patent Document 1 discloses a semiconductor device including a diamond layer embedded in a hole provided in a bottom surface of a substrate, a single-crystal nitride layer provided on an upper surface side of the substrate, and a device layer provided thereon. Diamond has the highest thermal conductivity among substances and is excellent in heat dissipation performance, and hence a field effect transistor including diamond can alleviate the limitation on output characteristics, enabling a high output operation.

PRIOR ART DOCUMENTS

Patent Documents

Patent Document 1: Japanese Patent Application Laid-Open No. 2015-517205

SUMMARY

Problem to be Solved by the Invention

However, as in Patent Document 1, in a configuration in which diamond is brought into contact with a crystalline nitride layer such as die single-crystal nitride layer, there is a problem in that a stress is generated due to difference in thermal expansion coefficients between the diamond and the crystalline nitride layer, thus generating a crack of the crystalline nitride layer due to the stress.

Therefore, the present invention has been made in view of the problems as described above, and has an object to provide a technology capable of suppressing a crack of a crystalline nitride layer which is generated due to a stress.

Means to Solve the Problem

A semiconductor device according to the present invention includes a crystalline nitride layer, a structure containing silicon selectively disposed on a first main surface of the crystalline nitride layer, and a diamond layer disposed at least on a lateral portion of die structure and having a void between the diamond layer and die first main surface of the crystalline nitride layer.

Effects of the Invention

According to the present invention, owing to the void, a stress caused by difference in thermal expansion coefficients between the diamond layer and the crystalline nitride layer can be relaxed, thereby being capable of suppressing a crack of the crystalline nitride layer which is generated due to die stress.

An object, features, aspects, and advantages of the present invention become more obvious with the following detailed description and the attached drawings.

DESCRIPTION OF EMBODIMENTS

Now, description is given of embodiments with reference to the attached drawings. Note that, the drawings are schematically illustrated, and a mutual relationship between the size and the position of components each illustrated in different drawings are not necessarily illustrated accurately, but may be changed as appropriate.

First Embodiment

Figure 1:
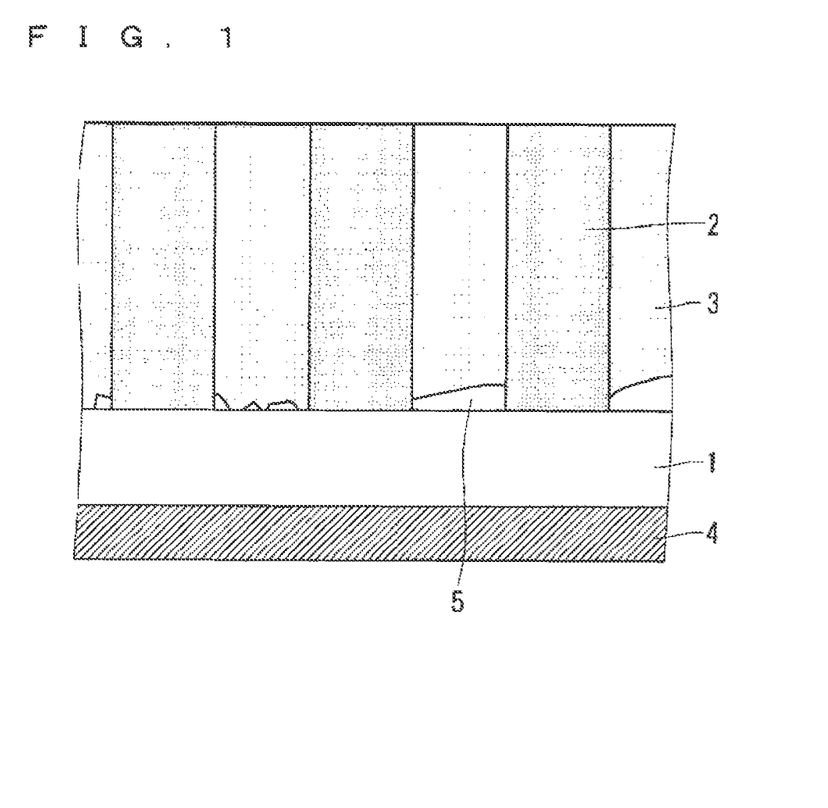
FIG. 1 is a cross-sectional view illustrating a configuration of a semiconductor device according to a first embodiment.

FIG. 1 is a cross-sectional view illustrating a configuration of a semiconductor device (group III nitride semiconductor device) according to a first embodiment of the present invention.

In a structure in which diamond is brought into contact with a crystalline nitride layer, there is a problem in that a crack of the crystalline nitride layer is generated due to di(Terence in thermal expansion coefficients between the diamond and the crystalline nitride layer. As will be apparent in the description below, the semiconductor device of FIG. 1 is capable of solving such a problem.

The semiconductor device of FIG. 1 includes a crystalline nitride layer 1, a structure 2 containing silicon (Si), a diamond layer 3, and a device layer 4. The structure 2 is selectively disposed on an upper surface (first main surface) of the crystalline nitride layer 1. The diamond layer 3 is disposed at least on a lateral portion of the structure 2, and a stress absorbing space 5 being a void is provided between the diamond layer 3 and the upper surface of the crystalline nitride layer 1.

The stress absorbing space 5 is defined by at least a crystal plane of the diamond layer 3 and the upper surface of the crystalline nitride layer 1, and is capable of absorbing (relaxing) a stress caused by difference in thermal expansion coefficients between die diamond layer 3 and the crystalline nitride layer 1. Accordingly, a crack of the crystalline nitride layer 1 generated due to the stress can be suppressed. As a result, generation of a crack is suppressed, and a semiconductor device having excellent heat dissipation performance and a high output can be manufactured.

Next, detailed description is given of each component of the semiconductor device according to this first embodiment.

Figure 2:
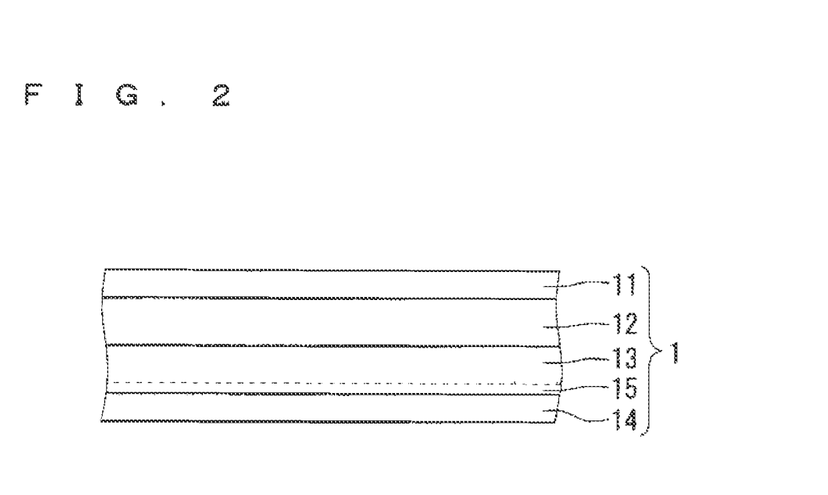
FIG. 2 is a cross-sectional view illustrating a configuration of a crystalline nitride layer according to the first embodiment.

It is preferable that, as illustrated in FIG. 2, the crystalline nitride layer 1 be formed of nitride semiconductors such as an AlN layer 11, a single-crystal $Al_{1-x}Ga_xN$ ($0 \leq x \leq 1$) multilayer film 12, a single-crystal GaN layer 13, and a single-crystal $Al_{1-x}Ga_xN$ ($0 \leq x \leq 1$) layer 14. Further, it is preferable that each of these layers have a film thickness within a range of from several tens of nanometers to several micrometers. Further, it is preferable that the AlN layer 11 be polycrystalline.

According to the crystalline nitride layer 1 as described above, owing to a heterojunction structure of the single-crystal GaN layer 13 and the single-crystal $Al_{1-x}Ga_xN$ layer 14, a two dimensional electron gas 15 is formed. For this reason, a nitride semiconductor device having a high frequency, a high drain current, and high output voltage density (e.g., a field effect transistor) can be realized. Note that, the crystalline nitride layer 1 is not limited to the one described above, and the crystalline nitride layer 1 may be formed of a nitride insulator such as $Si_3N_4$.

The structure 2 is a structure disposed on the crystalline nitride layer 1, and is a three dimensional structure having a surface formed by a height direction from a surface of the crystalline nitride layer 1 and a depth direction. In this first embodiment, a plurality of structures 2 are disposed on the upper surface of the crystalline nitride layer 1.

The diamond layer 3 is disposed at least on a lateral portion of the structure 2, and the stress absorbing space 5 is provided between the diamond layer 3 and the crystalline nitride layer 1. In this first embodiment, the diamond layer 3 is disposed to be adjoined to adjacent structures 2 among the plurality of structures 2.

Note that, it is preferable that the structure 2 be formed of silicon (Si) or silicon carbide (SiC). Thermal expansion coefficients of Si and SiC are 3.0 and 4.3, respectively, which are closer to a thermal expansion coefficient of the diamond layer 3 (2.3) than a thermal expansion coefficient of the crystalline nitride layer 1 (5.6) is, and hence a thermal stress can be reduced.

Further, in a configuration in which diamond and crystalline nitride GaN are brought into contact, a thermal stress generated in GaN in a case where temperature is changed from 1000° C. to 25° C. of room temperature is estimated to be 650 MPa based on calculation. On the other hand, in a configuration in which diamond and Si are brought into contact, a thermal stress generated in Si in a case of a similar temperature change is estimated to be 90 MPa. For this reason, a crack of the structure 2 is less liable to be generated.

The device layer 4 is disposed on a lower surface (second main surface) that is opposite to the upper surface of die crystalline nitride layer 1. As in this first embodiment, in a case where the semiconductor device is a transistor, the device layer 4 is a conductive layer serving functions of a source, a drain, and a gate, and includes a source electrode, a drain electrode, and a gate electrode. Note that, in a case where the semiconductor device is not a transistor (e.g., in a case where the semiconductor device is a diode), the device layer 4 is not limited thereto.

The above-mentioned stress absorbing space 5 that absorbs (relaxes) a stress is defined by at least a crystal plane of the diamond layer 3 and the upper surface of the crystalline nitride layer 1. Note that, the stress absorbing space 5 may be defined by a surface of die structure 2 in addition to die crystal plane of the diamond layer 3 and the upper surface of the crystalline nitride layer 1. Further, the stress absorbing space 5 need not necessarily be an enclosed space, and an upper portion, a lateral portion, or the like thereof may be opened.

<Manufacturing Method>

Next, description is given of a manufacturing method for a semiconductor device according to this first embodiment. Particularly in the description below, description is given taking an example of a manufacturing method for a semiconductor device having the configuration of FIG. 2 as the crystalline nitride layer 1.

Figure 3:
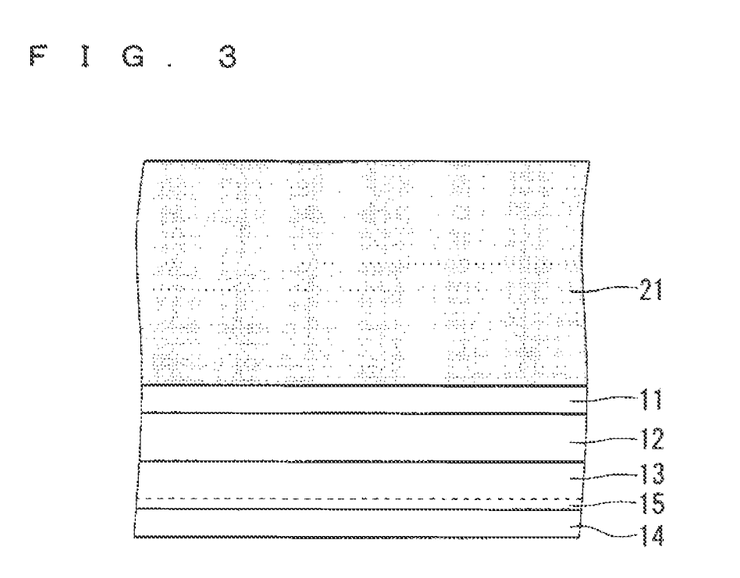
FIG. 3 is a cross-sectional view illustrating a manufacturing method for a semiconductor device according to the first embodiment.

First, as illustrated in FIG. 3, the crystalline nitride layer 1 is formed (prepared) on a Si substrate 21. For example, on a lower surface of the Si substrate 21, a plurality of epitaxial layers formed of the AlN layer 11, die single-crystal $Al_{1-x}Ga_xN$ multilayer film 12, the single-crystal GaN layer 13, and the single-crystal $Al_{1-x}Ga_xN$ layer 14 were formed in the slated order with a metal organic chemical vapor deposition (MOCVD) method. Trimethylgallium (TMGa), trimethylaluminum (TMA), and ammonia ($NH_3$) were used for raw materials, and a flow rate and a forming time thereof were adjusted, thereby forming a film of each layer.

Next, in the Si substrate 21, a Si oxide film as a processing film 7 is formed in a surface that is opposite to the surface where the film of die AlN layer 11 and the like are formed, and patterning is performed on the processing film 7 using a resist that is subjected to patterning so as to have a desired shape as a mask. Then, using the processing film 7 subjected to the patterning so as to have the desired shape as a mask, the Si substrate 21 is selectively etched with a reactive ion etching (RIE) method using, for example, $CF_4$ and $O_2$. Then, etching of the Si substrate 21 is finished using the AlN layer 11 as a stopper.

Figure 4:
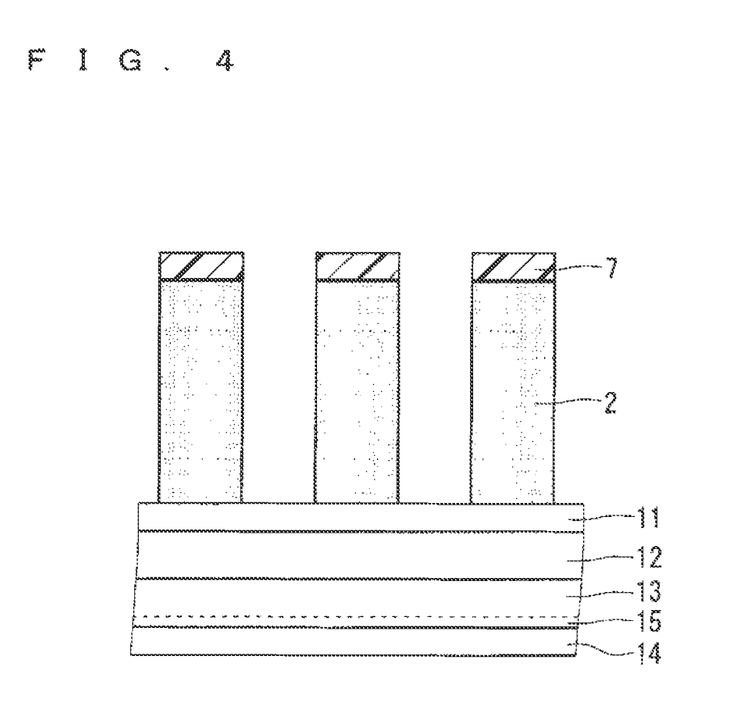
FIG. 4 is a cross-sectional view illustrating the manufacturing method for a semiconductor device according to the first embodiment.
Figure 5:
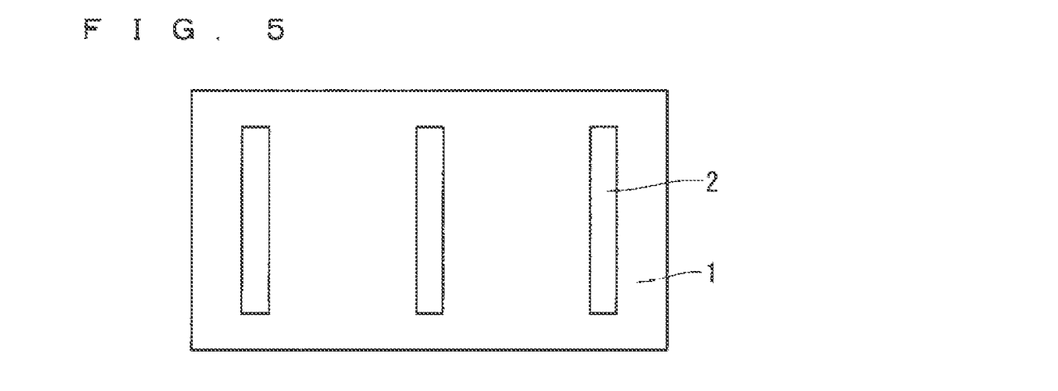
FIG. 5 is a planar view illustrating the manufacturing method for a semiconductor device according to the first embodiment.
Figure 6:
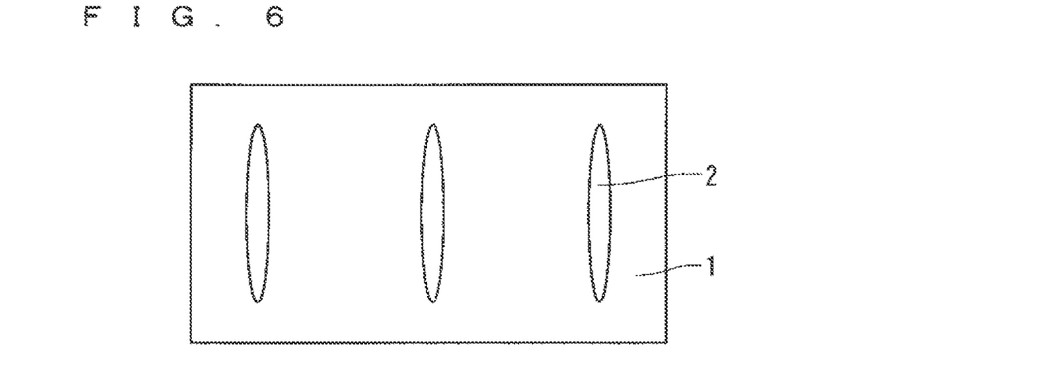
FIG. 6 is a planar view illustrating the manufacturing method for a semiconductor device according to the first embodiment.

With this, the plurality of structures 2 containing Si as illustrated in FIG. 4 are formed on the upper surface of the crystalline nitride layer 1 in line. In this first embodiment, the structure 2 has a rectangular shape in a cross-sectional view. Note that, tire structure 2 may have a rectangular shape in a top view as illustrated in FIG. 5, or may have an elliptic shape in a top view as illustrated in FIG. 6. Note that, the shape of the structure 2 in a top view is not limited to the above shapes, and may be a polygonal shape, such as a triangular shape, a pentagonal shape, and a hexagonal shape, a circular shape, or a star-like shape. These shapes may be freely formed by performing patterning on or processing a resist.

Note that, when the height of the structure 2 is excessively small, formation of growth nuclei of diamond on a lateral surface of the structure 2 becomes difficult in a later process. On the other hand, an upper limit of the height of the structure 2 is determined by the thickness of die above-mentioned Si substrate 21, and hence when the height of die structure 2 is excessively large, cost is increased. For this reason, it is preferable dial the height of the structure 2 be, for example, 1 µm or more and 650 µm or less.

Further, although not shown, the AlN layer 11 that appears on a surface due to etching of the Si substrate 21 may further be etched. Then, the single-crystal $Al_{1-x}Ga_xN$ multilayer film 12 that appears on a surface due to the etching itsy further be etched. Such etchings may be performed by, for example, generating an Ar ion beam obtained by accelerating Ar ions with several hundreds of voltages to several kilovolts, and applying die beam to a layer or a film to be subjected to the etching white using the structure 2 as a mask. According to die configuration in which the AlN layer 11 and the single-crystal $Al_{1-x}Ga_xN$ multilayer film 12 are removed through etching, the diamond layer 3 can be brought further closer to the single-crystal GaN layer 13 which generates heat, and hence heat dissipation performance can further be enhanced.

Note that, in the description below, the crystalline nitride layer 1 and the structure 2 that are formed through the process so far may be collectively referred to as a "nitride substrate."

Next, in a surface of the structure 2, growth nuclei of diamond are formed. For example, the nitride substrate is immersed in a solution obtained by dispersing diamond fine particles in pure water, and ultrasonic waves are applied thereto for 30 minutes.

It is preferable that the size of the diamond fine particles to be used as the growth nuclei of diamond be from 2 nm to 10 µm. Further, it is preferable that power density of the ultrasonic waves be from 0.1 to 5 $W/cm^2$. With this, the growth nuclei of diamond can be selectively formed only on a surface of the structure 2 containing Si without being formed on a surface of the crystalline nitride layer 1.

Note that, in a case where the nitride substrate is thin, the nitride substrate may be cracked al die lime of formation of the growth nuclei of diamond or the like. In such a case, before performing the etching process for forming the structure 2, another substrate such as a Si substrate (not shown) as a base may be previously bonded to a lower surface side of the crystalline nitride layer 1 (side opposite to the Si substrate 21). With this, the above-mentioned crack can be suppressed.

Further, the growth nuclei of diamond may be formed after removing (peeling off) the processing film 7. In this case, the growth nuclei of diamond are formed also on the upper surface of the structure 2 that was in contact with the processing film 7. As a result, the diamond layer 3 can be formed not only on the lateral surface of the structure 2 but also on the upper surface of the structure 2 in a process described later.

Figure 7:
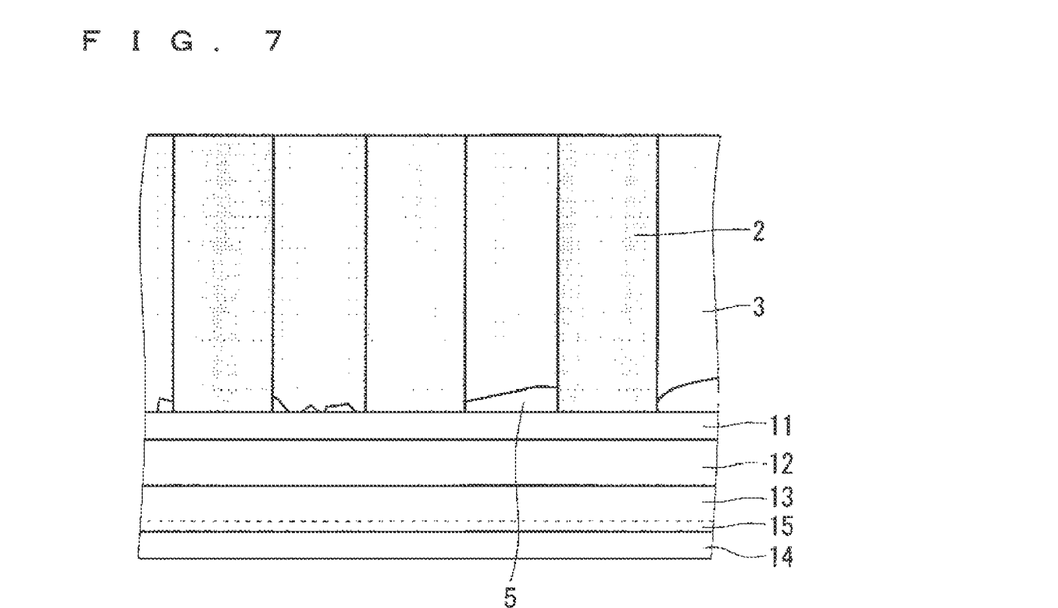
FIG. 7 is a cross-sectional view illustrating the manufacturing method for a semiconductor device according to the first embodiment.

Now, after forming the growth nuclei of diamond as described above, the processing film 7 is peeled off with hydrofluoric acid. After that, the growth nuclei of diamond are grown, thereby forming die diamond layer 3 at least on a lateral portion of the structure 2 as illustrated in FIG. 7. For example, with a plasma CVD method using microwaves, die diamond layer 3 is formed using methane ($CH_4$), hydrogen ($H_2$), and oxygen ($O_2$) for raw materials. Here, a film was formed with a flow rate of $CH_4$ of 50 sccm, a flow rate of $H_2$ of 500 sccm, a flow rate of $O_2$ of 10 sccm, a pressure of 13.3 kPa, temperature of 1000° C., and power of microwaves of 5 kW. As a result, the polycrystalline diamond layer 3 was formed, and the crystal size thereof was in a range of from 2 µm to 100 µm.

Note that, in general, diamond has a characteristic less liable to be grown on a nitride than on Si. Owing to this characteristic, the stress absorbing space (void) 5 having al least a portion being defined by a surface of the crystalline nitride layer 1 and a crystal plane of the diamond layer 3 can be formed.

Further, the diamond layer 3 may be formed with hot filament CVD. In this case, instead of decomposing a gas in which power of microwaves is injected, a filament is energized to heat up or raise the temperature of the filament, thereby decomposing a gas. It is preferable that the temperature of the filament be, for example, 1500° C. or more and 3000° C. or less. As a lower limit of the temperature of the filament, temperature necessary for the decomposition of a gas is applied, mid upper limit temperature is determined by heat tolerance of a filament material (e.g., tungsten).

Incidentally, in a stacking structure in which diamond and GaN are brought into contact, a thermal stress to be generated in GaN in a case where temperature is brought back to 25° C. of room temperature from a temperature of 850° C. or more is 570 MPa or a value slightly higher than that. A crack of GaN is generated at a temperature from 850° C. or more, and hence the stress value of 570 MPa is considered to be a threshold value concerning a crack of GaN.

In view of this, it is preferable that a total area of the stress absorbing space 5 in a plan view be 12% or more of an entire area of the upper surface of the crystalline nitride layer 1. With this, as compared to a configuration in which the diamond layer is brought into contact with the entire upper surface of the crystalline nitride layer 1, a stress to be applied to the crystalline nitride layer 1 can be reduced by 12% or more. As a result, in a configuration in which diamond and crystalline nitride GaN are brought into contact, a thermal stress (650 MPa) generated in GaN (crystalline nitride layer 1) in a case where temperature is changed from 1000° C. to 25° C. of room temperature can be reduced to the above-mentioned threshold value (570 MPa) or less. Accordingly, even under an environment where temperature is changed from 1000° C. to 25° C., a crack of the crystalline nitride layer 1 can be reduced.

Note that in accordance with the crystal size of the diamond layer 3, the size of the area of the upper surface of the crystalline nitride layer 1 forming the stress absorbing space 5 can be controlled. Specifically, when the crystal size of the diamond layer 3 is increased, the area of the upper surface of the crystalline nitride layer 1 funning the stress absorbing space 5 can be increased. Further, in order to increase the crystal size of the diamond layer 3, density of growth nuclei of diamond formed in a surface of the structure 2 only needs to be reduced, and in order to reduce the density of the growth nuclei, time for ultrasonic waves at die time of formation of the growth nuclei only needs to be reduced.

Further, after forming the diamond layer 3, a film which is not shown may further be formed on the diamond layer 3. A film is formed in this manner, thereby being capable of enhancing strength of the nitride substrate. Note that, it is preferable that a material of this film be highly conductive metal.

Next, the device layer 4 is framed on a side of a lower surface (lower surface of the single-crystal $Al_{1-x}Ga_xN$ layer 14) that is opposite to the upper surface of the crystalline nitride layer 1. As a conductive layer included in the device layer 4, for example, a metallic layer or a layer obtained by doping a semiconductor layer with impurity to reduce resistance is preferable. Further, the device layer 4 is formed by, for example, a CVD method, a vapor deposition method, a sputtering method, or the tike.

The process as described above is performed, thereby completing the semiconductor device illustrated in FIG. 1.

Gist of First Embodiment

According to the semiconductor device of this first embodiment as described above, the stress absorbing space 5 is provided between the diamond layer 3 and the upper surface of the crystalline nitride layer 1. According to such a configuration, owing to the stress absorbing space 5, a stress caused by difference in thermal expansion coefficients between the diamond layer 3 and the crystalline nitride layer 1 can be absorbed (relaxed), and hence a crack of the crystalline nitride layer 1 generated due to the stress can be suppressed.

Second Embodiments

Figure 8:
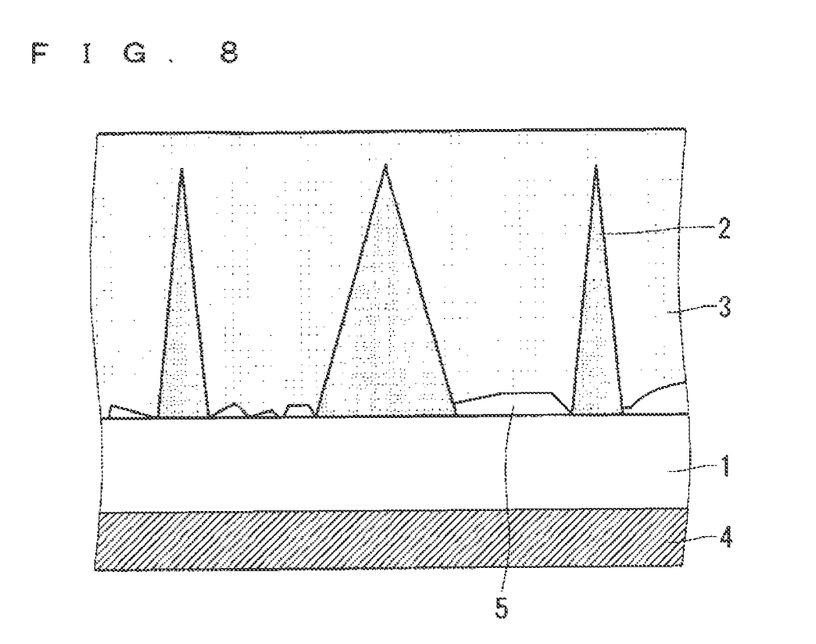
FIG. 8 is a cross-sectional view illustrating a configuration of a semiconductor device according to a second embodiment.

FIG. 8 is a cross-sectional view illustrating a configuration of a semiconductor device according to a second embodiment of the present invention. In the description below, in the semiconductor device according to this second embodiment, components that are the same as or similar to diose of the first embodiment are denoted by the same reference symbols, and different components are mainly described.

Difference of the semiconductor device according to this second embodiment from the semiconductor device according to the first embodiment resides in that the structure 2 has a triangular shape in a cross-sectional view. With this, adjacent lateral surfaces of adjacent structures 2 are unparallel to each other. Specifically, in adjacent first structure 2 and second structure 2, a lateral surface close to the second structure 2 in a lateral surface of the first structure 2 and a lateral surface close to the first structure 2 in a lateral surface of the second structure 2 are unparallel to each other. Meanwhile, similarly to the first embodiment, the structure 2 may have a rectangular shape in a top view as illustrated in FIG. 5, or may have an elliptic shape in a top view as illustrated in FIG. 6.

According to the configuration as described above, the diamond layer 3 has a shape that widens upward. That is, from the crystalline nitride layer 1 toward the upper side, the volume of the structure 2 can be gradually decreased and a proportion of the diamond layer 3 can be gradually increased. Accordingly, heat generated in the crystalline nitride layer 1 can be efficiently dissipated in the diamond layer 3 excellent in heat dissipation performance via the structure 2, and hence heat dissipation performance can be enhanced.

Incidentally, as in the semiconductor device according to die first embodiment (FIG. 1), in a configuration in which adjacent lateral surfaces of the adjacent structures 2 are parallel to each oilier, diamond layers growing perpendicularly from each of the adjacent lateral surfaces collide at the front at the time of forming the diamond layers 3, thereby deteriorating crystallinity of the diamond layer 3 in the colliding region. In contrast, in this second embodiment, adjacent lateral surfaces of the adjacent structures 2 are unparallel to each other, and hence the frontal collision as described above can be suppressed, thereby being capable of suppressing deterioration in crystallinity of the diamond layer 3. With this, crystallinity of the diamond layer 3 can be enhanced, and heat dissipation performance can be enhanced as a result.

Note that, when an angle in a cross-sectional view formed between a bottom surface (surface in contact with the crystalline nitride layer 1) of the structure 2 and a lateral surface of the structure 2 is excessively large, the above-mentioned crystallinity of the diamond layer 3 is deteriorated to be unable to enhance heat dissipation performance, and when the angle is excessively small, the stress absorbing space 5 becomes large to deteriorate heat dissipation performance conversely. Therefore, it is preferable that, in a case where a direction perpendicular to the upper surface of the crystalline nitride layer 1 is defined to be 90 degrees, the angle formed between the bottom surface and the lateral surface of the structure 2 be an acute angle of, for example, 5 degrees or more and 85 degrees or less.

Further, the structure 2 may have a trapezoidal shape having the bottom surface wider than the upper surface in a cross-sectional view. Also in this case, the diamond layer 3 has a shape that widens upward, and adjacent lateral surfaces of the adjacent structures 2 are unparallel to each other. Accordingly, similarly to the above-mentioned configuration in which the structure 2 has a triangular shape in a cross-sectional view, heat dissipation performance can be enhanced.

Next, brief description is given of difference of a manufacturing method for a semiconductor device according to this second embodiment from the first embodiment.

In the processing for the Si substrate 21 according to the first embodiment (FIG. 3 and FIG. 4), using the processing film 7 subjected to patterning so as to have a desired shape as a mask, a reactive ion etching (RIE) method using, for example, $CF_4$ and $O_2$ was conducted. That is, etching was conducted under a highly anisotropic condition.

In contrast, in this second embodiment, etching is conducted under a highly isotropic condition m place of the highly anisotropic condition. Specifically, reactive ion etching (RIE) is conducted by changing a pressure from 16 Pa that increases anisotropy to 50 Pa that increases isotropy. With this, as illustrated in FIG. 8, the structure 2 having a triangular shape or the like in a cross-sectional view can be formed. Alter that, when the process similar to the first embodiment is performed, the semiconductor device illustrated in FIG. 8 is completed.

Third Embodiment

Figure 9:
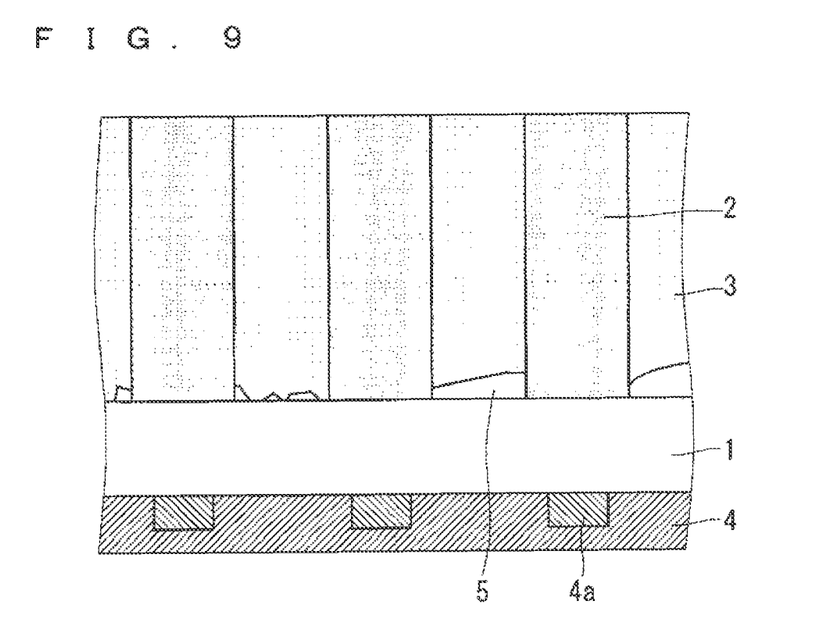
FIG. 9 is a cross-sectional view illustrating a configuration of a semiconductor device according to a third embodiment.

FIG. 9 is a cross-sectional view illustrating a configuration of a semiconductor device according to a third embodiment of the present invention. In the description below, in the semiconductor device according to this third embodiment, components that are the same as or similar to those of the first embodiment are denoted by the same reference symbols, and different components are mainly described.

In this third embodiment, a gate electrode 4a is included in the device layer 4. The gate electrode 4a is selectively disposed on the second main surface that is opposite to the First main surface of the crystalline nitride layer 1. Further, at least a part of the gate electrode 4a is positioned below the structure 2.

Here, heat generation occurs inside the crystalline nitride layer 1 above the gate electrode 4a. In view of this, in this third embodiment, al least a part of die gate electrode 4a is positioned below the structure 2, and hence die above-mentioned heat can be more easily transmitted to the structure 2. With this, the above-mentioned heat can be efficiently dissipated in the diamond layer 3 via the structure 2, and hence heat dissipation performance can be enhanced.

Note that, it is preferable that, due to performance required for a transistor, the width of the gate electrode 4a be, for example, from 100 nm to 100 μm, and that the pitch of the gate electrode 4a be, for example, from 10 μm to 100 μm. For this reason, it is preferable that the width of the structure 2 also be, for example, from 100 nm to 100 μm, and that the pitch thereof also be, for example, from 10 μm to 100 μm.

Further, the gate electrodes 4a are disposed in a chip in the number of, for example, 10 or more and 1000 or less, and correspondingly thereto, the structures 2 are disposed in the chip also in the number of, for example, 10 or more and 1000 or less. Further, it is preferable that the size of a chip be such that a side thereof is 0.5 mm or more and 50 mm or less.

Next, brief description is given of difference of a manufacturing method for a semiconductor device according to this third embodiment from the first embodiment.

A range of the gate electrode 4a (range in which at least a part thereof is positioned below the structure 2) is taken into consideration in advance at the time of performing the processing for the Si substrate 21 (FIG. 3 and FIG. 4), and the structure 2 is formed. After that, the process similar to the first embodiment is performed, and in a process of forming the device layer 4, the gate electrode 4a is formed in the above-mentioned range set in advance. With this, the semiconductor device illustrated in FIG. 9 is completed.

Fourth Embodiment

Figure 10:
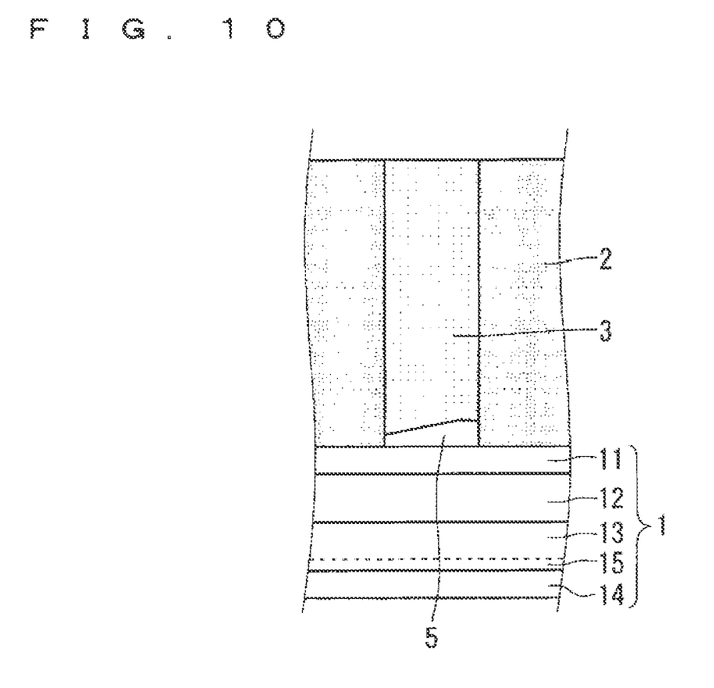
FIG. 10 is a cross-sectional view illustrating a configuration of a semiconductor device according to a fourth embodiment.

FIG. 10 is a cross-sectional view illustrating a configuration of a semiconductor device according to a fourth embodiment of the present invention. In the description below, in the semiconductor device according to this fourth embodiment, components that are the same as or similar to those of the first embodiment are denoted by the same reference symbols, and different components are mainly described.

Difference of the semiconductor device according to this fourth embodiment from the semiconductor device according to the first embodiment resides in that, in a cross-sectional view, at least one of a plurality of diamond layers 3 is out of contact with the first main surface of the crystalline nitride layer 1. According to the configuration above, the crystalline nitride layer 1 being a nitride semiconductor and the diamond layer 3 are out of contact with each other, and hence influence of a thermal stress generated therebetween can be further reduced, and the effect of suppressing a crack of the crystalline nitride layer 1 can further be enhanced.

Note that, in this fourth embodiment, as a method of forming growth nuclei of diamond, a method of promoting generation of diamond nuclei utilizing surface roughness is used. In the description below, brief description is given of difference of such a manufacturing method for semiconductor device according to this fourth embodiment from the first embodiment.

In the processing for the Si substrate 21 according to the find embodiment (FIG. 3 and FIG. 4), using the processing film 7 subjected to patterning so as to have a desired shape as a mask, a reactive ion etching (RIE) method using, for example, $CF_4$ and $O_2$ was conducted, thereby removing the SI substrate 21 up to the first main surface of the crystalline nitride layer 1.

Figure 11:
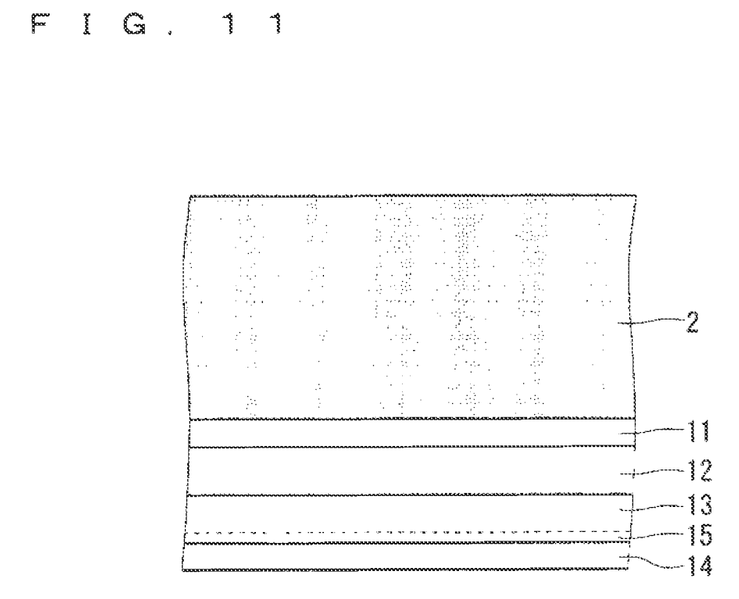
FIG. 11 is a cross-sectional view illustrating a manufacturing method for a semiconductor device according to the fourth embodiment.
Figure 12:
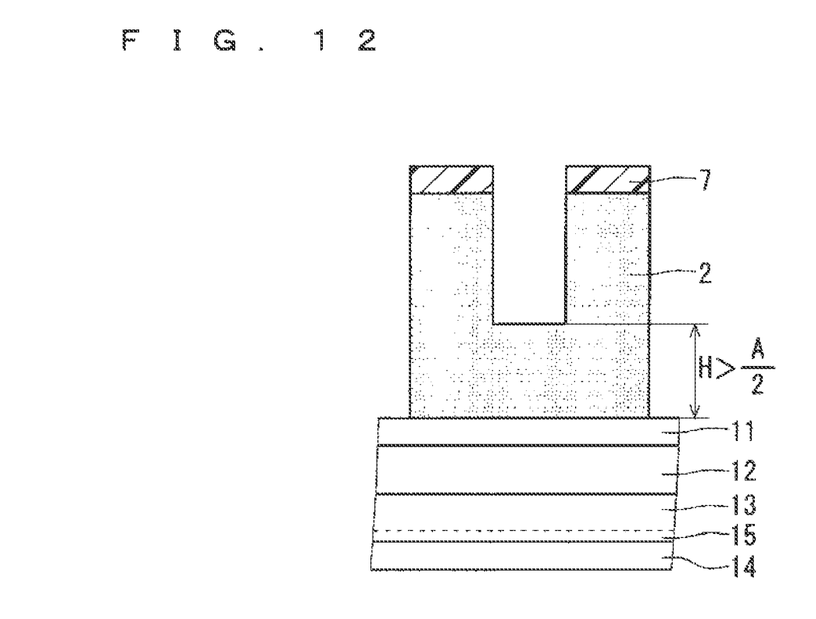
FIG. 12 is a cross-sectional view illustrating the manufacturing method for a semiconductor device according to the fourth embodiment.
Figure 14:
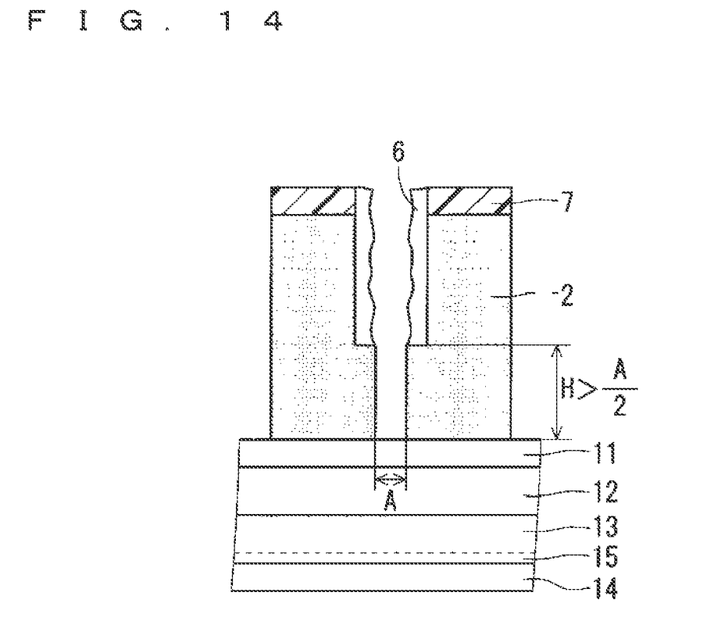
FIG. 14 is a cross-sectional view illustrating the manufacturing method for a semiconductor device according to the fourth embodiment.

In contrast, in this fourth embodiment, etching of the Si substrate 21 is once suspended before the first main surface of the crystalline nitride layer 1 is exposed (FIG. 11 and FIG. 12). Here, in a case where a distance between the adjacent structures 2 is a distance A as illustrated in FIG. 14, the position to suspend etching is a position where a height H from the first main surface of the crystalline nitride layer 1 is higher than A/2.

Etching is suspended as described above for the purpose of, in a later process, forming growth nuclei of diamond only in a region (hereinafter refereed to as a "specific region") in a surface of the structure 2 separated away from the first main surface of the crystalline nitride layer 1 by a distance larger than a half of die distance A between the plurality of structures 2. Diamond grows substantially isotropically, and hence in a case where growth nuclei of diamond are generated at a position higher than A/2 and diamond grows from the position, before the diamond that has grown from the growth nuclei reaches the first main surface of the crystalline nitride layer 1, diamonds growing from adjacent structures 2 are connected between the structures 2. As a result, the diamond layer 3 out of contact with the first main surface of the crystalline nitride layer 1 can be formed.

Figure 13:
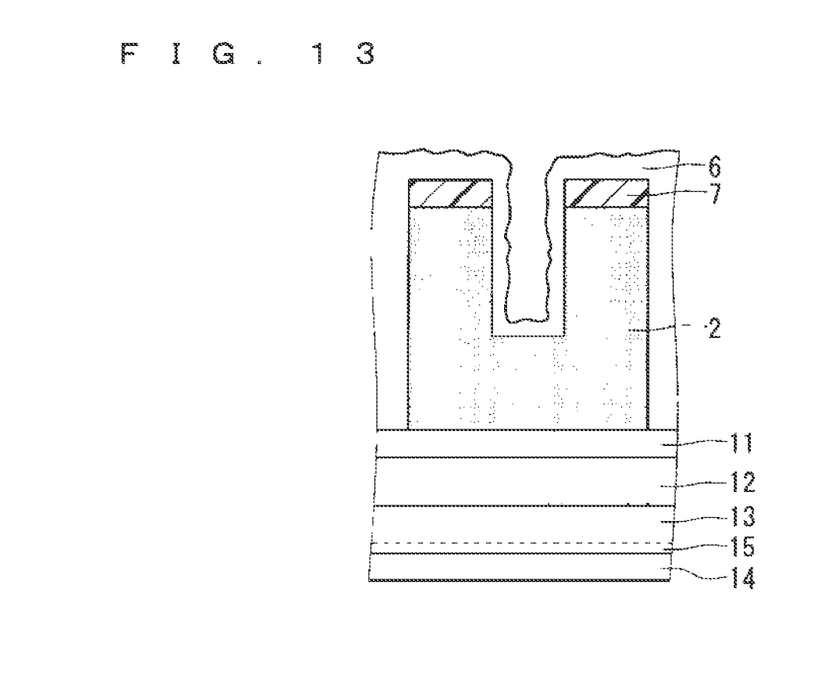
FIG. 13 is a cross-sectional view illustrating the manufacturing method for a semiconductor device according to the fourth embodiment.

Now, as in FIG. 12, after suspending etching as described above, as in FIG. 13, growth nuclei of diamond are formed in the specific region. In the example of FIG. 13, a thin film 6 having surface roughness of a certain range is formed as growth nuclei of diamond. For example, a Si thin film or the like is used as the thin film 6. It is preferable that the surface roughness have arithmetic average roughness Ra of, for example, from 0.1 nm to 100 nm. In a case where the thin film 6 has roughness in this range, diamond can be grown from die roughness of the thin film 6 and the like, and the thin film 6 can be used as the growth nuclei of diamond.

As formation of the Si thin film to be die thin film 6, a plasma CVD method was conducted under a condition of a flow rate of $SiH_4$ of 100 sccm, a flow rate of $H_2$ of 1000 sccm, a pressure of 3 Torr, power of 20 W, and a substrate temperature of 200° C. so as to have its film thickness of, for example, 100 nm. That is, the plasma CVD method was conducted under a condition where a ratio of $H_2/SiH_4$, i.e., a dilution ratio of hydrogen, was 10 (−1000/100). The arithmetic average roughness Ra of the Si thin film formed under this condition was 1.0 nm. Note that, when the dilution ratio of hydrogen is decreased less than 10 or increased to, for example, 500, along with die change in the dilution ratio of hydrogen, the arithmetic average roughness Ra of the Si thin film can be changed from 0.1 nm to 100 nm. When surface roughness such as die arithmetic average roughness Ra is increased, the effect of generating the growth nuclei of diamond can further be enhanced.

Note that, a Si thin film is herein used as the thin film 6; however, another film may be used as long as the film has the arithmetic average roughness Ra of, for example, from 0.1 nm to 100 nm, and a metallic film, a semiconductor film, an insulating film, or the like may be utilized. Note that, because the Si substrate 21 is etched to form the structure 2 in a later process, use of a Si-based material containing the same element as the Si substrate 21 for the thin film 6 is preferable in the respect of facilitating etching.

Next, etching of the Si substrate 21 is again conducted utilizing the processing film 7 as a mask, and the etching is conducted until the first main surface of die crystalline nitride layer 1 is exposed (FIG. 14). The etching is conducted such that surface roughness of a lower portion of the lateral surface of the structure 2 after etching, i.e., a region where the thin film 6 is not formed, becomes smaller that the surface roughness of foe thin film 6. Here, foe arithmetic average roughness Ra of the specific region where the Si thin film being foe thin film 6 was formed was 1.0 nm, and the arithmetic average roughness Ra of a region where the thin film 6 was not formed was 0.5 nm. When processing is performed as described above, the thin film 6 can be formed as growth nuclei of diamond, and as a result, substantially, diamond can be grown only from a surface of foe thin film 6.

Note that, in the etching of the Si substrate 21 herein, a portion in the Si thin film being the thin film 6 on foe processing film 7 side is also removed; however, when the thickness of foe processing film 7 to be used as a mask is adjusted, the thin film 6 can be reserved on a surface of the structure 2 as illustrated in FIG. 14.

Further, in die above, as a method of increasing surface roughness of the specific region, and as a method of forming growth nuclei of diamond in the specific region as well, foe method of forming the thio film 6 has been described, but a method is not limited thereto. For example, without using the thin film 6, growth nuclei of diamond can be formed in the specific region by roughening the specific region of the structure 2 using etching such as a $H_2$ gas to increase the surface roughness of the specific region.

After that, diamond is synthesized with a method similar to the method illustrated in the first embodiment. In a promotion of generation of diamond nuclei utilizing surface roughness, it is desirable that the substrate temperature be reduced so that the substrate temperature at the time of diamond synthesis using a microwave CVD method is, for example, approximately from 700° C. to 950° C. This is because reducing the substrate temperature provides tendency capable of suppressing generation of new nuclei in a region other than the specific region, thus allowing selectivity of generation of diamond nuclei due to difference in surface roughness to be enhanced. With this, the semiconductor device illustrated in FIG. 10 is completed.

Note that, in the present invention, each of the embodiments may be freely combined, and each of the embodiments may be modified or omitted as appropriate within the scope of the invention.

The present invention has been described in detail, but the above description is in all aspects illustrative, and the present invention is not to be limited thereto. It is understood that unillustrated numerous modification examples are assumable without departing from the scope of die present invention.

EXPLANATION OF REFERENCE SIGNS

1 crystalline nitride layer, 2 structure, 3 diamond layer, 4a gate electrode, 5 stress absorbing space, 6 thin film, 7 processing film.

The invention claimed is:

1. A semiconductor device, comprising:
   a crystalline nitride layer;
   a structure comprising silicon disposed on a first main surface of the crystalline nitride layer; and
   a diamond layer disposed at least on a lateral portion of the structure and having a void between the diamond layer and the first main surface of the crystalline nitride layer, wherein:
   (i) the first main surface of the crystalline nitride layer comprises a flat surface, and a lower end of the void and a lower end of the structure are in contact with the flat surface, (ii) the structure has an isolated pattern in a planar view and the diamond layer covers the structure in a planar view, or both (i) and (ii).

2. The semiconductor device according to claim 1, wherein the diamond layer has a shape that widens upward.

3. The semiconductor device according to claim 1, further comprising:
   a gate electrode disposed on a second main surface that is opposite to the first main surface of the crystalline nitride layer,
   wherein at least a part of the gate electrode is positioned below the structure.

4. The semiconductor device according to claim 1, wherein a plurality of the structures are disposed on the first main surface of the crystalline nitride layer, and the diamond layer is disposed to be adjoined to adjacent structures among the plurality of the structures.

5. The semiconductor device according to claim 1, wherein the first main surface of the crystalline nitride layer comprises a flat surface, and a lower end of the void and a lower end of the structure are in contact with the flat surface.

6. The semiconductor device according to claim 1, wherein the structure has an isolated pattern in a planar view and the diamond layer covers the structure in a planar view.

7. The semiconductor device according to claim 1, wherein the first main surface of the crystalline nitride layer comprises a flat surface, and a lower end of the void and a lower end of the structure are in contact with the flat surface, and
   wherein the structure has an isolated pattern in a planar view and the diamond layer covers the structure in a planar view.

8. A semiconductor device, comprising:
   a crystalline nitride layer;
   a structure comprising silicon disposed on a first main surface of the crystalline nitride layer; and
   a diamond layer disposed at least on a lateral portion of the structure and having a void between the diamond layer and the first main surface of the crystalline nitride layer,
   wherein a plurality of the structures are disposed on the first main surface of the crystalline nitride layer,
   the diamond layer is disposed to be adjoined to adjacent structures among the plurality of the structures, and
   at least one of a plurality of the diamond layers is out of contact with the first main surface of the crystalline nitride layer.

9. The semiconductor device according to claim 4, wherein adjacent lateral surfaces of the adjacent structures are unparallel to each other.

10. A method of manufacturing a semiconductor device, the method comprising:
    preparing a crystalline nitride layer;
    forming a structure comprising silicon on a first main surface of the crystalline nitride layer;
    forming a growth nucleus of diamond on a surface of the structure; and
    forming, at least on a lateral portion of the structure, a diamond layer having a void between the diamond layer and the first main surface of the crystalline nitride layer by growing the growth nucleus.

11. The method of claim 10,
wherein during the forming the growth nucleus of diamond, the growth nucleus is formed in a region in a surface of the structure separated away from the first main surface of the crystalline nitride layer by a distance larger than a half of a distance between a plurality of the structures.

12. The method of claim 10, further comprising:
forming a gate electrode on a second main surface that is opposite to the first main surface of the crystalline nitride layer,
wherein at least a part of the gate electrode is positioned below the structure.

* * * * *